(12) United States Patent
Maiuzzo et al.

(10) Patent No.: US 6,211,732 B1
(45) Date of Patent: *Apr. 3, 2001

(54) COMB LINEAR AMPLIFIER COMBINER (CLAC)

(75) Inventors: Michael A. Maiuzzo, Queenstown, MD (US); Shing T. Li, San Diego, CA (US); John W. Rockway, San Diego, CA (US); James H. Schukantz, San Diego, CA (US); Daniel W. Tam, San Diego, CA (US)

(73) Assignee: Sentel Corporation, Alexandria, VA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/041,872

(22) Filed: Mar. 12, 1998

(51) Int. Cl.⁷ ........................................................ H03F 3/68
(52) U.S. Cl. ..................... 330/126; 330/295; 330/124 R; 330/362; 330/306
(58) Field of Search ..................................... 330/302, 303, 330/304, 305, 306, 124 R, 126, 295

(56) References Cited

U.S. PATENT DOCUMENTS

| 3,988,679 | 10/1976 | Clake et al. | 325/377 |
| 4,811,422 | * 3/1989 | Kahn | 330/126 |
| 4,819,227 | 4/1989 | Rosen | 370/75 |
| 5,170,489 | 12/1992 | Glazebrook | 455/63 |
| 5,200,709 | * 4/1993 | Saito et al. | 330/126 |
| 5,260,674 | 11/1993 | Hulick | 332/149 |
| 5,365,362 | 11/1994 | Gnauck et al. | 359/174 |
| 5,412,336 | * 5/1995 | Takano | 330/306 |
| 5,471,647 | 11/1995 | Gerlach et al. | 455/63 |
| 5,548,819 | 8/1996 | Robb | 455/59 |
| 6,049,707 | * 4/2000 | Buer et al. | 330/124 R |

FOREIGN PATENT DOCUMENTS

| 07/2632 A1 | 3/1997 | (EP) | H03F/3/21 |
| WO 97/41642 | 11/1997 | (WO) | H04B/1/02 |

OTHER PUBLICATIONS

Von Just–Dietrich Buchs, "Requirements For Future Transmit Amplifiers for Communications Satellites with Respect to Tubes and Solid State Components" 2213 Frequenz, 45 No. (1) pp. 1–9 (Jan./Feb. 1991).

Gentzler, "Class A Design Techniques Create a New Broad band Amplifier" 8396 RF Design, 16 No.5 pp. 47–50 & 52–54 (May 1993).

U.S. application No. 03/988,679, Clarke et al., 325/377, filed Oct. 26, 1976.

U.S. application No. 05/365,362, Gnauck et al., 359/174, filed Nov. 15, 1994.

"ACN Design Development For Antenna System/EMI Mitigation System" DARPA/STO, Mar. 9, 1998.

* cited by examiner

*Primary Examiner*—Michael B Shingleton
(74) *Attorney, Agent, or Firm*—Roberts Abokhair & Mardula, LLC

(57) ABSTRACT

The present invention is a Comb linear amplifier combiner (CLAC) apparatus that allows one or more transmitters to transmit through one transmit antenna. The CLAC apparatus passes low powered transmit signals through a bank of bandpass filters. The transmit signals then pass through Class A amplifiers which amplify the transmit signals to the full transmit power. The full transmit power signals then pass through a second bank of bandpass filters. The transmission signals are then transmitted through a single transmission antenna.

20 Claims, 1 Drawing Sheet

COMB LINEAR AMPLIFIER COMBINER (CLAC)

RELATIONSHIP TO OTHER APPLICATIONS

The present disclosure is a continuation-in-part application related to the U.S. patent application entitled "Comb Limiter Combiner (CLIC)," Ser. No. 08/868,473, filed on Jun. 3, 1997. This patent incorporates U.S. patent application Ser. No. 08/868,473 by reference in its entirety.

STATEMENT OF GOVERNMENT INTEREST

The invention was made with Government support under contract F19628-95-C-0060 awarded by Hanscomb Air Force Base and Joint Spectrum Center. The Government has certain rights in the invention.

FIELD OF THE INVENTION

This invention relates generally to connecting one or more transmitters to a single transmit antenna. More particularly, the present invention is used to mitigate intermodulation effects in transmitters for wideband transmission.

BACKGROUND OF THE INVENTION

Military communications need to be secure. One method to achieve secure communications is to use wideband (spread spectrum) communications systems. Wideband communications are effective against anti-jam communications and have a low probability of being intercepted. In the commercial industry, wideband communications allow multiple users to communicate over the same communication line at the same time. However, wideband communications comes with some problems as well. When two or more radios are using wideband radio transmission or a single radio is multiplexing multiple radio signals, mutual interference is a frequently encountered. Mutual interference is primarily a non-linear effect caused by saturation and intermodulation in the radios. Mutual interference results in a reduced communication range for any given signal strength that would not otherwise occur absent the mutual interference.

Presently, there are two methods to reduce mutual interference, antenna separation and bandpass filtering. Antenna separation is an easy and effective solution to solve mutual interference problems. However, antenna separation requires space, which may not always be available. For instance military ships have barely enough space for one antenna. Additional space for other antennas with proper antenna separation is virtually impossible. Considering that most ships also require more than one secure radio the problem is magnified.

Therefore there is a need to provide a means for secure communication from multiple radios where proper antenna separation is not feasible.

SUMMARY OF THE INVENTION

It is therefore an object of the present invention to connect one or more transmitters to a single transmitting antenna.

A further object of the present invention is to restrict intermodulation products to the passband of a single passband filter.

A further object of the present invention is to operate without knowledge of the frequency excursions of the transmitted signal.

A further object of the present invention is to operate without switching and control circuitry.

The present invention is a Comb Linear Amplifier Combiner (CLAC) apparatus that allows one or more transmitters to transmit through one transmit antenna. The CLAC apparatus passes low-powered transmit signals through a bank of bandpass filters. The transmit signals then pass through CLAC amplifiers which amplify the transmit signals to the full transmit power. The full transmit power signals then pass through a second bank of bandpass filters. The transmission signals are then transmitted through a single transmission antenna.

The CLAC apparatus reduces the intermodulation effects in two ways. First, the CLAC amplifiers are linear Class A amplifiers which reduce the power levels of the intermodulation products. Secondly, the CLAC apparatus reduces the number of intermodulation products by employing frequency selective power amplification. Therefore, at any given time, only a small fraction of the transmitters' signals are in the passband of a given amplifier.

DETAILED DESCRIPTION OF THE INVENTION

Figure 1:
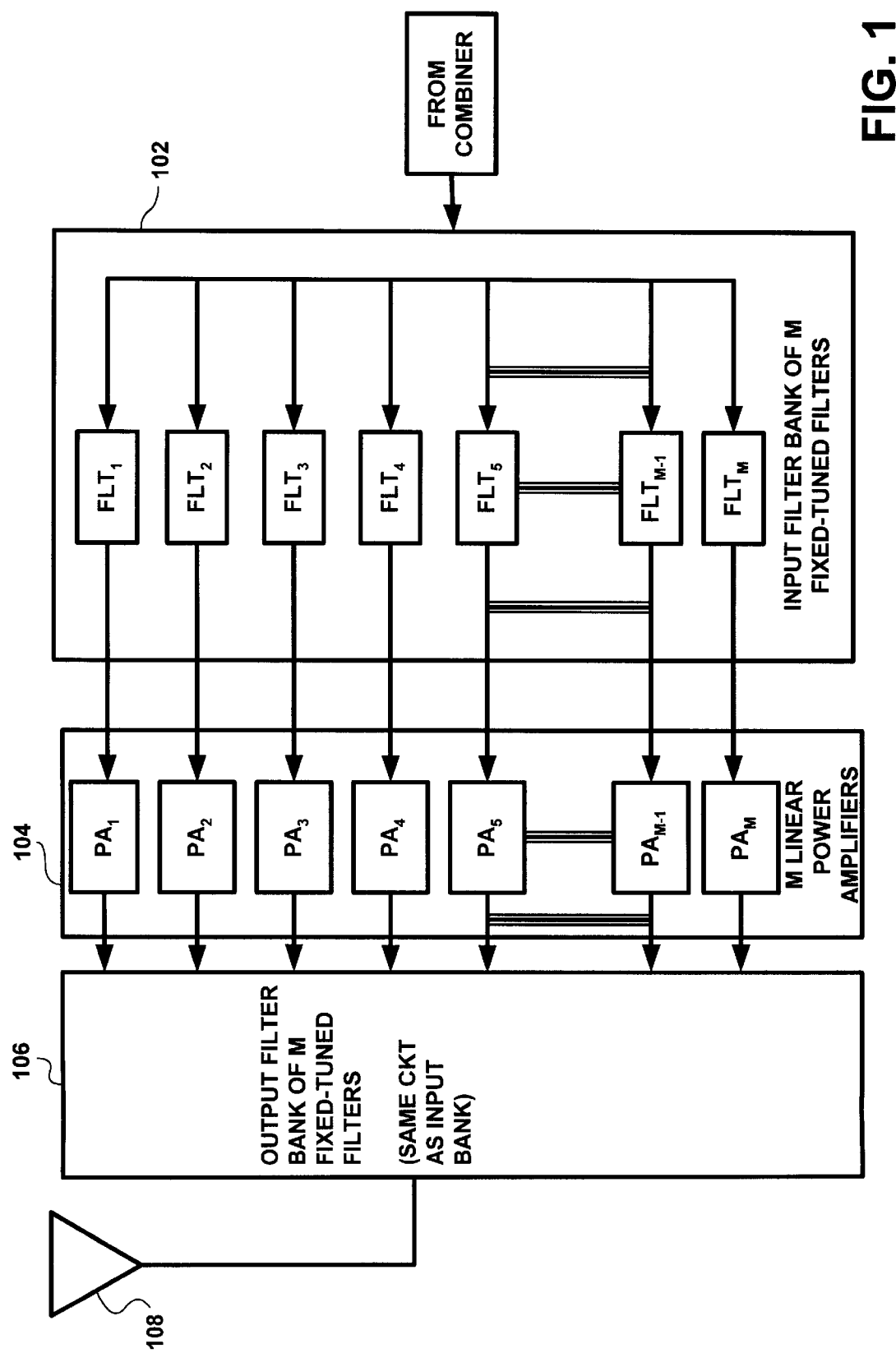
FIG. 1 is a diagram of the Comb Limiter Amplifier Combiner.

Referring to FIG. 1, a diagram of a Comb Linear Amplifier Combiner (CLAC) is shown. The CLAC is used for transmitting wideband radio communications. Low powered wideband radio transmission signals come from a combiner which is coupled to a radio (not shown). In the preferred embodiment, the radio is a digital communication radio.

As shown, the low powered transmission signals enter input (first) filter bank 102. Input filter bank 102 contains multiple bandpass filters with each filter spanning a portion of a wideband or ultra-wideband communications signal. The center frequency and passband of each input filter in input filter bank 102 is selected to balance the channel separation of the communications signal and the typical frequency separation of strong interfering signals. Each input bandpass filter preferably has a bandwidth small enough so that the possibility of two or more signals occurring in the same passband is sufficiently low. Furthermore, each input bandpass filter has sufficient rolloff to avoid the generation of significant intermodulation products in adjacent passbands. To cover the entire communications signal bandwidth, the passbands of input bandpass filters 102 generally overlap at the 3 dB points.

The transmission signals then enter a bank of linear power amplifiers 104. In the preferred embodiment, power amplifiers 104 are Class A amplifiers. Power amplifiers 104 amplify the filtered transmission signals to the full transmission power.

The Class A amplifiers are used because the amplifiers reduce the number of intermodulation products. Since Class A amplifiers operate entirely in the biased or active region, the resulting amplified transmission signals are typically more linear than other types of amplified signals. In addition, power amplifiers 104 reduce the number of intermodulation products by employing frequency selective power amplification. Since only a small fraction of the transmission signal is in each passband only a frequency limited signal is being amplified which reduces the number of intermodulation products as well.

The amplified transmission signals then pass through output (second) filter bank 106. In the preferred embodiment, output filter bank 106 is identical to input filter bank 102. In an alternate embodiment, output filter bank 106 can be eliminated. Again, the filter bank filters the desired transmission signals and rejects noise and other extraneous signals. After the transmission signals are filtered, the fully amplified transmission signals are transmitted through transmission antenna 108.

The Comb Linear Amplifier Combiner of the present invention may be designed for virtually any frequency band according to well known techniques of filter design. Different types of bandpass filters may also be used, including but not limited to cavity, stripline, surface acoustic waves, and LC (inductor and capacitor) filters.

Although this invention has been described using banks of filters and multiple power amplifiers, alternate embodiments can be implemented using one input filter, one power amplifier, and one output filter. However, by reducing the number of components, the overall system will be less effective in reducing intermodulation interferences.

A Comb Linear Amplifier Combiner for transmitting at least one radio through one transmit antenna has been described in detail for the purpose of illustration. It is understood that such detail is solely for that purpose, and variations can be made therein by those skilled in the art without departing from the scope of the invention as disclosed.

We claim:

1. An apparatus for amplifying a wideband signal for transmission by a single antenna while suppressing intermodulation products in the wideband signal, the apparatus comprising:
   a comb filter receiving the wideband signal for filtering, the comb filter having a single input port and N output ports, wherein each output port is connected to the input port via a respective one of N first bandpass filters, wherein the desired RF signal is passed through the N first bandpass filters and wherein each of the N first bandpass filters has a different center frequency than the others of the N first bandpass filters, and wherein each of the N first bandpass filters has a frequency response that is substantially exclusive of the frequency components passed by the other ones of the N first bandpass filters so that intermodulation products in the wideband signal are suppressed;
   a comb linear amplifier, the comb linear amplifier comprising N power amplifiers, wherein each one of the N power amplifiers is a linear power amplifier and wherein each one of the N power amplifiers is connected to receive input from a different, respective output port of the comb filter and produce output at one of N outputs of the comb amplifier;
   a filter bank, the filter bank comprising N second bandpass filters that each have an output, wherein each one of the N second bandpass filters has a center frequency substantially the same as a respective one of the N first bandpass filters and being connected to receive input from a respective one of the N outputs of the comb amplifier, and wherein each of the N second bandpass filters has a frequency response that is substantially exclusive of the frequency components passed by the other ones of the N second bandpass filters so that intermodulation products in the wideband signal are suppressed;
   a combining node formed by connecting the output of each of the N second bandpass filters together as a single node to provide low loss combining; and
   a single wideband antenna connected to the combining node.

2. The apparatus of claim 1, wherein the linear amplifiers are Class A amplifiers.

3. The apparatus of claim 1, wherein the first bandpass filters are selected from the group consisting of cavity, stripline, surface acoustic wave, and LC filters.

4. The apparatus of claim 1, wherein the second bandpass filters are selected from the group consisting of cavity, stripline, surface acoustic wave, and LC filters.

5. The apparatus of claim 1, wherein each one of the N first bandpass filters has bandwidth and frequency roll-off characteristics substantially the same as the other ones of the N first bandpass filters.

6. The apparatus of claim 1, further comprising:
   an M-way combiner having M input ports and an output port, the output port of the M-way combiner being connected to the single input port of the comb filter, wherein at least one radio is coupled to the M input ports of the combiner.

7. The apparatus of claim 6, wherein the at least one radio comprises a digital radio.

8. The apparatus of claim 1, further comprising:
   multiple wideband antennas connected to the combining node.

9. An apparatus for amplifying a wideband signal for transmission by a single antenna, the apparatus comprising:
   a comb filter receiving the wideband signal for filtering, the comb filter having a single input port and N output ports, wherein each output port is connected to the input port via a respective one of N first bandpass filters, wherein the desired RF signal is passed through the N first bandpass filters and wherein each of the N first bandpass filters has a different center frequency than the others of the N first bandpass filters, and wherein each of the N first bandpass filters has a frequency response that is substantially exclusive of the frequency components passed by the other ones of the N first bandpass filters;
   a comb linear amplifier, the comb linear amplifier comprising N power amplifiers, wherein each one of the N power amplifiers is a linear power amplifier and wherein each one of the N power amplifiers is connected to receive input from a different, respective output port of the comb filter and produce output at one of N outputs of the comb amplifier;
   a filter bank, the filter bank comprising N second bandpass filters that each have an output, wherein each one of the N second bandpass filters has a center frequency substantially the same as a respective one of the N first bandpass filters and being connected to receive input from a respective one of the N outputs of the comb amplifier, and wherein each of the N second bandpass filters has a frequency response that is substantially exclusive of the frequency components passed by the other ones of the N second bandpass filters;
   a combining node formed by connecting the output of each of the N second bandpass filters together as a single node to provide low loss combining; and
   the single antenna, connected to the combining node so as to receive the wideband signal from the filter bank for transmission thereby.

10. The apparatus of claim 9, wherein the first bandpass filters are selected from the group consisting of cavity, stripline, surface acoustic wave, and LC filters.

11. The apparatus of claim 9, wherein the second bandpass filters are selected from the group consisting of cavity, stripline, surface acoustic wave, and LC filters.

12. The apparatus of claim 9, wherein each one of the N first bandpass filters has bandwidth and frequency roll-off characteristics substantially the same as the other ones of the N first bandpass filters.

13. The apparatus of claim 9, further comprising:

an M-way combiner having M input ports and an output port, the output port of the M-way combiner being connected to the single input port of the comb filter, wherein at least one radio is coupled to the M input ports of the combiner.

14. The apparatus of claim 13, wherein the at least one radio comprises a digital radio.

15. An apparatus for amplifying a wideband signal for transmission while suppressing intermodulation products in the wideband signal, the apparatus comprising:

a comb filter receiving the wideband signal for filtering, the comb filter having a single input port and N output ports, wherein each output port is connected to the input port via a respective one of N first bandpass filters, wherein the desired RF signal is passed through the N first bandpass filters and wherein each of the N first bandpass filters has a different center frequency than the others of the N first bandpass filters, and wherein each of the N first bandpass filters has a frequency response that is substantially exclusive of the frequency components passed by the other ones of the N first bandpass filters so that intermodulation products in the wideband signal are suppressed;

a comb linear amplifier, the comb linear amplifier comprising N power amplifiers, wherein each one of the N power amplifiers is a linear power amplifier and wherein each one of the N power amplifiers is connected to receive input from a different, respective output port of the comb filter and produce output at one of N outputs of the comb amplifier;

a filter bank, the filter bank comprising N second bandpass filters that each have an output, wherein each one of the N second bandpass filters has a center frequency substantially the same as a respective one of the N first bandpass filters and being connected to receive input from a respective one of the N outputs of the comb amplifier, and wherein each of the N second bandpass filters has a frequency response that is substantially exclusive of the frequency components passed by the other ones of the N second bandpass filters so that intermodulation products in the wideband signal are suppressed;

a combining node formed by connecting the output of each of the N second bandpass filters together as a single node to provide low loss combining; and a single wideband antenna connected to the combining node, wherein the wideband signal is coupled to the single wide band antenna for transmission thereby.

16. The apparatus of claim 15, wherein the first bandpass filters are selected from the group consisting of cavity, stripline, surface acoustic wave, and LC filters.

17. The apparatus of claim 15, wherein the second bandpass filters are selected from the group consisting of cavity, stripline, surface acoustic wave, and LC filters.

18. The apparatus of claim 15, wherein each one of the N first bandpass filters has bandwidth and frequency roll-off characteristics substantially the same as the other ones of the N first bandpass filters.

19. The apparatus of claim 15, further comprising:

an M-way combiner having M input ports and an output port, the output port of the M-way combiner being connected to the single input port of the comb filter, wherein at least one radio is coupled to the M input ports of the combiner.

20. The apparatus of claim 19, wherein the at least one radio comprises a digital radio.

* * * * *